United States Patent
Chen

(10) Patent No.: US 9,214,443 B2
(45) Date of Patent: Dec. 15, 2015

(54) EUTECTIC SOLDER STRUCTURE FOR CHIP

(71) Applicant: LEXTAR ELECTRONICS CORPORATION, Hsinchu (TW)

(72) Inventor: Yi-Jyun Chen, Chiayi County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/272,468

(22) Filed: May 7, 2014

(65) Prior Publication Data

US 2015/0108650 A1 Apr. 23, 2015

(30) Foreign Application Priority Data

Oct. 17, 2013 (TW) .............................. 10213437 A

(51) Int. Cl.
*H01L 23/00* (2006.01)
(52) U.S. Cl.
CPC ......... *H01L 24/32* (2013.01); *H01L 2224/2908* (2013.01); *H01L 2224/32054* (2013.01); *H01L 2224/32056* (2013.01); *H01L 2224/32113* (2013.01); *H01L 2224/32225* (2013.01); *H01L 2224/32502* (2013.01); *H01L 2924/0105* (2013.01); *H01L 2924/01028* (2013.01); *H01L 2924/01029* (2013.01); *H01L 2924/01047* (2013.01); *H01L 2924/01079* (2013.01); *H01L 2924/01083* (2013.01); *H01L 2924/01322* (2013.01)

(58) Field of Classification Search
CPC .................. H01L 2924/014; H01L 2924/151; H01L 24/32; H01L 2224/32502; H01L 2924/1029; H01L 2224/32225; H01L 2924/1322; H01L 2224/2908; H01L 2924/105

USPC ........................... 257/772, E23.015, E23.02, 257/E23.023–E23.079, 738, 779–781, 751, 257/750, 762, 766
See application file for complete search history.

(56) References Cited

U.S. PATENT DOCUMENTS

| | | | | |
|---|---|---|---|---|
| 6,095,400 | A * | 8/2000 | Liu | 228/56.3 |
| 2005/0221634 | A1* | 10/2005 | Hilty et al. | 439/70 |
| 2009/0004500 | A1* | 1/2009 | Suh et al. | 428/576 |
| 2013/0001782 | A1* | 1/2013 | Otsuka et al. | 257/751 |

FOREIGN PATENT DOCUMENTS

| | | |
|---|---|---|
| CN | 102601477 A | 7/2012 |
| TW | 201244123 A | 11/2012 |

OTHER PUBLICATIONS

Taiwan Patent Office, Office Action, Patent Application Serial No. 102137437, Jul. 23, 2015, Taiwan.

* cited by examiner

*Primary Examiner* — Lynne Gurley
*Assistant Examiner* — Tong-Ho Kim

(57) ABSTRACT

The present invention provides a eutectic solder structure for a chip including a substrate and a solder structure on the substrate. The solder structure includes an alternate lamination of a plurality of first metal layers and a plurality of second metal layers, wherein each second metal layer has a continuous region and a plurality of openings and the melting point of the plurality of second metal layers is higher than that of the plurality of first metal layers. The eutectic solder structure for a chip also includes a chip on the solder structure, wherein the chip is bonded to the substrate by a eutectic reaction of the solder structure.

8 Claims, 9 Drawing Sheets

EUTECTIC SOLDER STRUCTURE FOR CHIP

CROSS REFERENCE TO RELATED APPLICATIONS

This application claims priority of Taiwan Patent Application No. 102137437, filed on Oct. 17, 2013, the entirety of which is incorporated by reference herein.

BACKGROUND OF THE INVENTION

1. Field of the Invention

The present invention relates to a low-temperature chip bonding technology, and in particular relates to a eutectic solder structure for a chip that can bond chip at a relatively low temperature.

2. Description of the Related Art

The metal eutectic bonding process is a widely used bonding technology which can be involved in three-dimensional integrated circuit (3DIC) technology and can be utilized in the packaging processes of electronic devices such as light-emitting diodes (LEDs), laser diodes (LDs), or micro-electromechanical systems (MEMS). Due to features such as the structure of metal atoms being closely packed and the eutectic temperature of multicomponent metal system being lower than the melting point of pure metal, the bonding process can be carried out at a relatively low temperature. Accordingly, the negative effects brought about by the high-temperature process can be avoided.

Conventionally, when a chip is bonded onto a substrate through a metal eutectic bonding process, continuous metal layers having different melting points are alternately laminated on a bonding substrate to form a solder structure. Then, a heat treatment is performed to facilitate the reaction of the solder structure for forming intermetallic compounds such that a stable bonding can be achieved. However, when the process temperature is greater than or approximate to the melting point of the metal layer having a relatively low melting point, the fluidity of the metal layer having the relatively low melting point will increase. As a result, the metal layer having the relatively low melting point may flow to the outside of the solder structure, and voids may be formed in the solder structure or the solder structure may collapse. Accordingly, it is hard to obtain good bonding interface properties.

Though the existing eutectic solder structure has been used in various applications, a eutectic solder structure that can solve the above problems is still under requirement.

BRIEF SUMMARY OF THE INVENTION

A detailed description is given in the following embodiments with reference to the accompanying drawings.

An embodiment of the present disclosure involves a eutectic solder structure for a chip, comprising a substrate and a solder structure on the substrate. The solder structure includes an alternate lamination of a plurality of first metal layers and a plurality of second metal layers, wherein each second metal layer has a continuous region and a plurality of openings, and the melting point of the plurality of second metal layers is higher than that of the plurality of first metal layers. A chip is disposed on the solder structure, wherein the chip is bonded to the substrate by an eutectic reaction of the solder structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
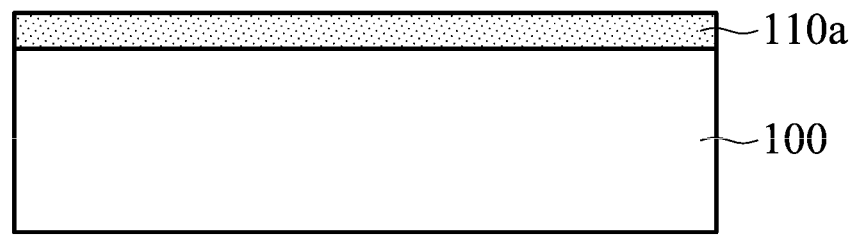
FIGS. 1A-1F are cross-sectional views of a manufacturing process of an eutectic solder structure for a chip according to one embodiment of the present invention.

The following description is set forth in order to provide a thorough understanding of the disclosed embodiments. The following description and the drawings are made for the purpose of illustrating the general principles of the disclosure and should not be taken in a limiting sense. The present disclosure may repeat reference numerals and/or letters in the various examples. This repetition is for the purpose of simplicity and clarity and does not in itself dictate a relationship between the various embodiments and/or drawings discussed. The scope of the invention is best determined by reference to the appended claims.

Refer to FIGS. 1A-1F, which illustrate a series of cross-sectional views of a manufacturing process of a eutectic solder structure for a chip according to one embodiment of the present invention. First, a first metal layer $110a$ is formed on a substrate $100$. The first metal layer $110a$ may be in direct contact with the substrate $100$, as shown in FIG. 1A. The substrate $100$ is not limited as long as it is a carrier having a carrying ability. The substrate $100$ may be a lead frame, a package element (for example, a package substrate), or a semiconductor wafer. In one embodiment, the substrate $100$ is a metal lead frame. The first metal layer $110a$ may include tin (Sn), copper (Cu), bismuth (Bi), gold (Au), silver (Ag), nickel (Ni), or alloys thereof. The first metal layer $110a$ may be formed by a sputtering process or a e-beam evaporation process. For example, the first metal layer $110a$ may be a tin layer on the substrate $100$ and formed by a sputtering process, and the first metal layer $110a$ is in direct contact with the substrate $100$.

Figure 1B:
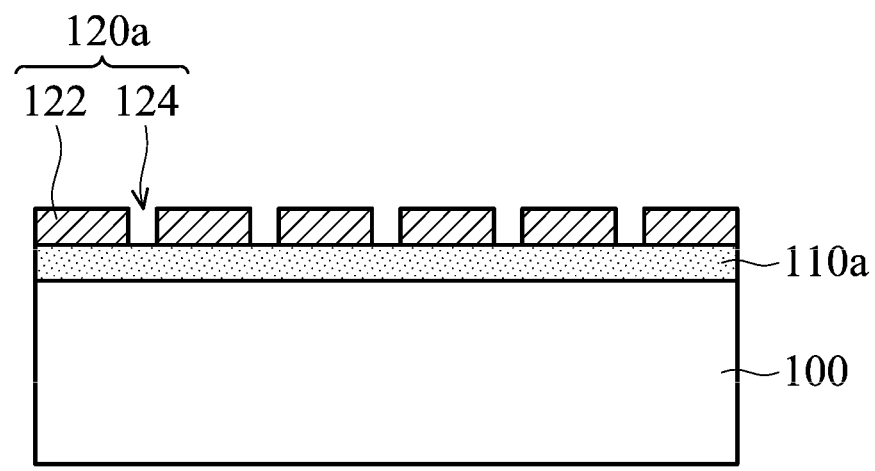

Next, after a continuous layer of a second metal material is formed on the first metal layer $110a$, a plurality of openings $124$ is formed in the continuous layer of the second metal material by a patterning process. Accordingly, a second metal layer $120a$ having a continuous region $122$ and a plurality of openings $124$ is obtained, as shown in FIG. 1B. The second metal layer $120a$ and the first metal layer $110a$ are formed by different metal materials, and the melting point of the second metal layer $120a$ is higher than that of the first metal layer $110a$. In the embodiment, the second metal layer $120a$ may include tin, copper, bismuth, gold, silver, nickel, or alloys thereof, and the second metal layer $120a$ must be formed by a metal material having a melting point higher than that of the first metal layer $110a$. Moreover, the second metal layer $120a$ may be formed by a sputtering process or a e-beam evaporation process. For example, the second metal layer $120a$ may be a copper layer formed by a sputtering process.

Figure 4B:
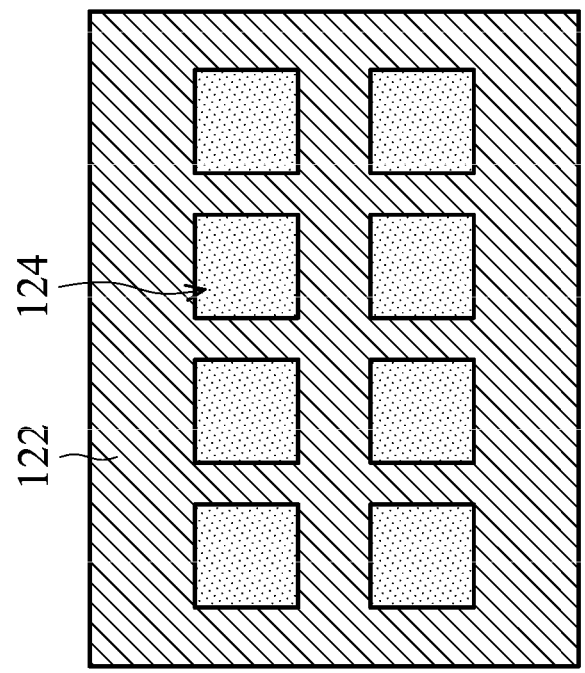
FIGS. 4A-4B, 5A-5B, 6A-6B, 7A-7B, and 8A-8B are plan views of adjacent second metal layers in eutectic solder structures for chips according to various embodiments of the present invention.
Figure 4A:
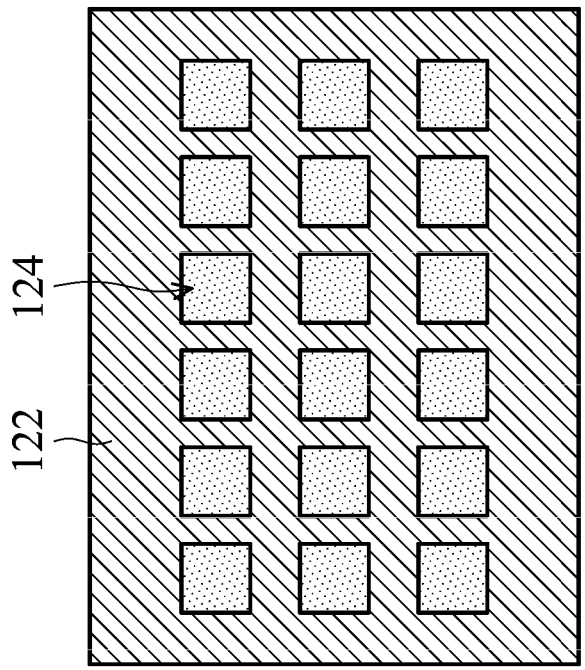
Figure 5B:
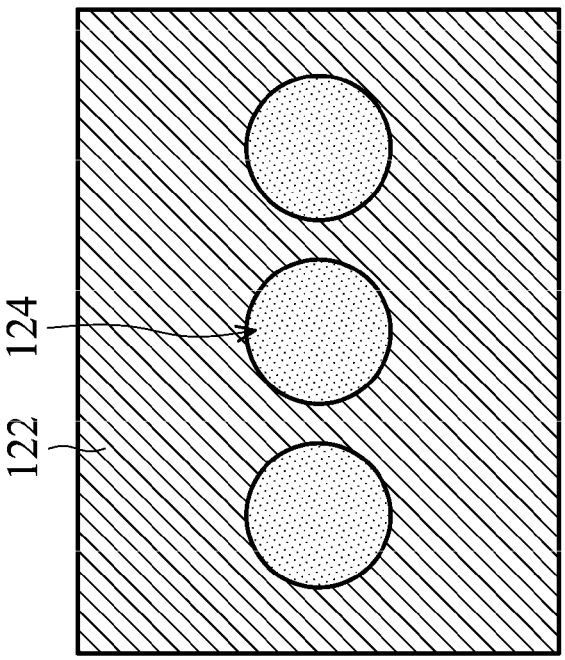
Figure 5A:
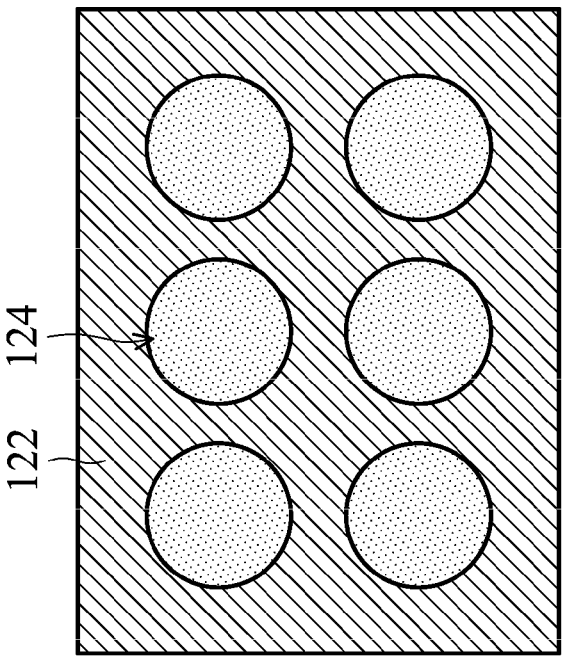
Figure 6B:
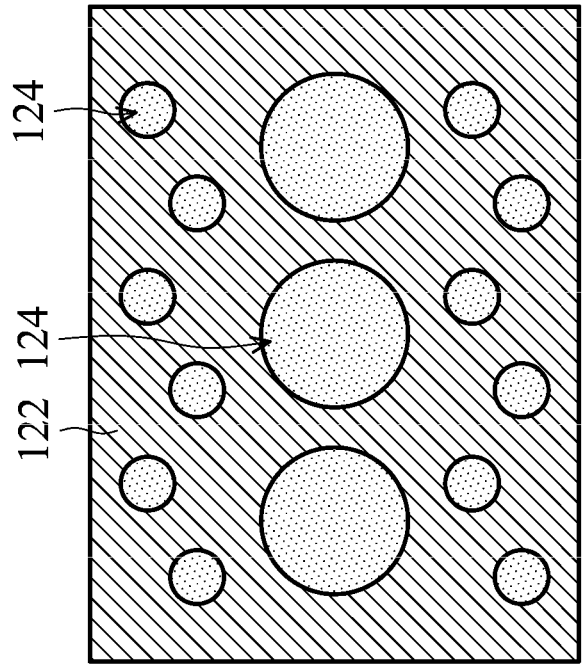
Figure 6A:
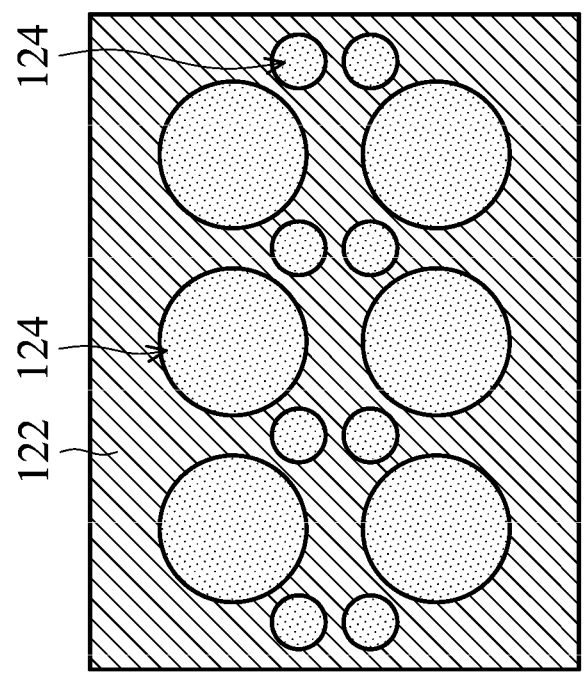
Figure 7B:
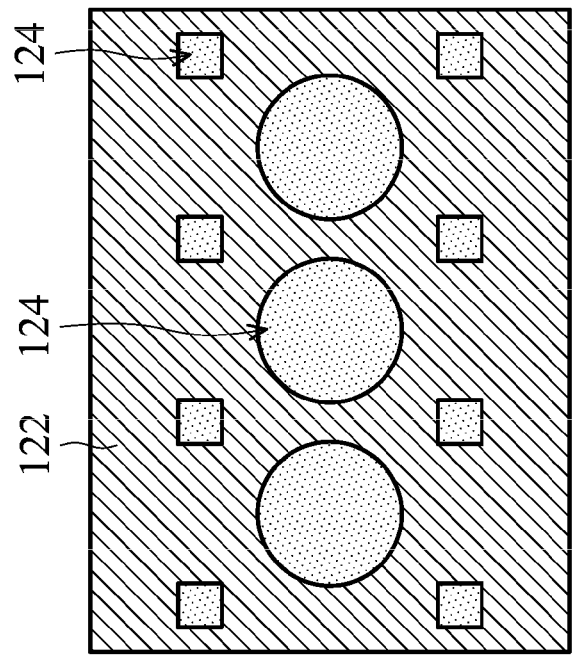
Figure 7A:
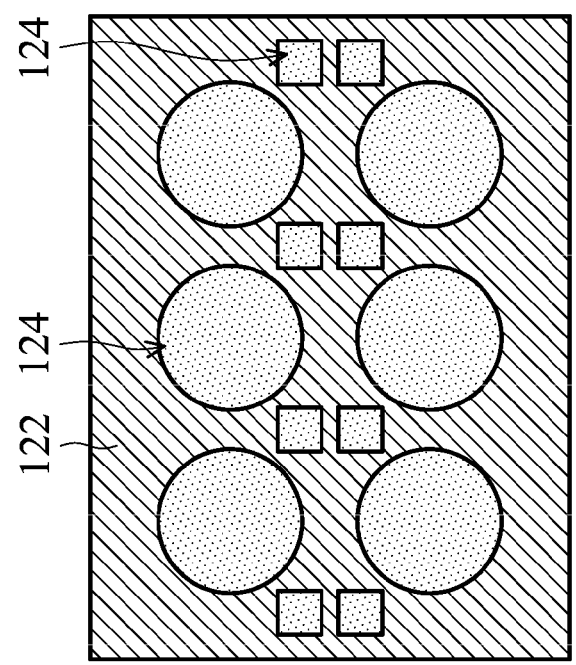
Figure 8B:
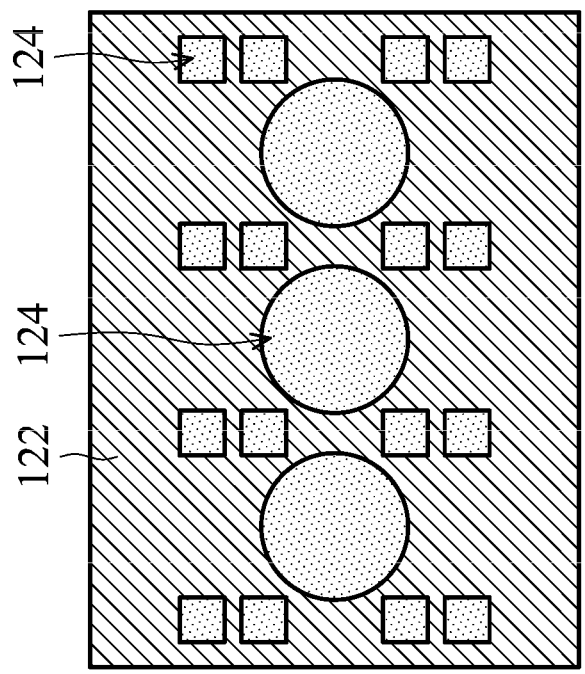
Figure 8A:
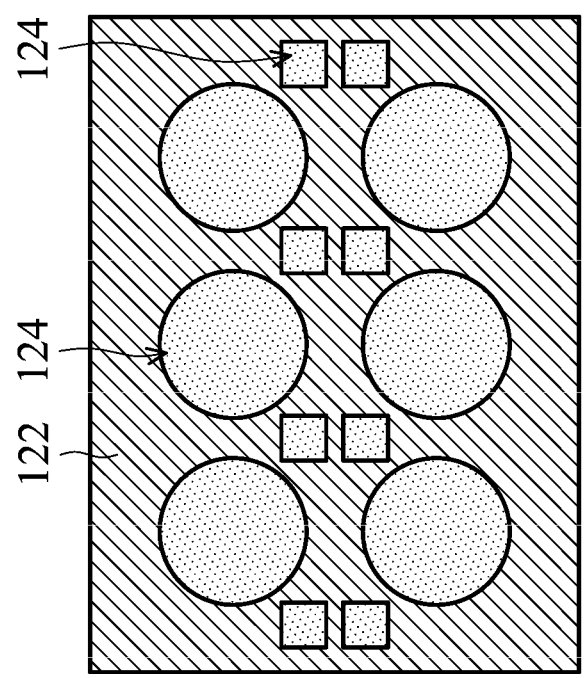

Refer to FIGS. 1B, 4A, 5A, 6A, 7A, and 8A, the plurality of openings $124$ of the second metal layer $120a$ may be formed as a rectangle and/or a circle, and each opening $124$ may have the same or different sizes. Preferably, a total basal area of the plurality of openings $124$ of the second metal layer $120a$ is greater than a half of a total area of the continuous region 122 and less than nine-tenths of a total area of the continuous region 122. In one embodiment, the plurality of openings 124 of the second metal layer 120a may be rectangular openings that are regularly arranged and have substantially the same side lengths, as shown in FIG. 4A. In one embodiment, the plurality of openings 124 of the second metal layer 120a may be circular openings that are regularly arranged and have substantially the same diameters, as shown in FIG. 5A. In one embodiment, the plurality of openings 124 of the second metal layer 120a may be circular openings that are regularly arranged but have different diameters. For example, a plurality of openings having relatively small diameters near each relatively large opening, as shown in FIG. 6A. In one embodiment, the plurality of openings 124 of the second metal layer 120a may be openings that are regularly arranged but have different sizes and shapes. For example, a plurality of circular openings having relatively large areas and a plurality of rectangular openings having relatively small areas near each relatively large opening, as shown in FIGS. 7A and 8A. The patterning process for forming the continuous area 122 and the plurality of openings 124 of the second metal layer 120a is not limited as long as the continuous area 122 and the plurality of openings 124 can be formed having a desired geometry.

Figure 1C:
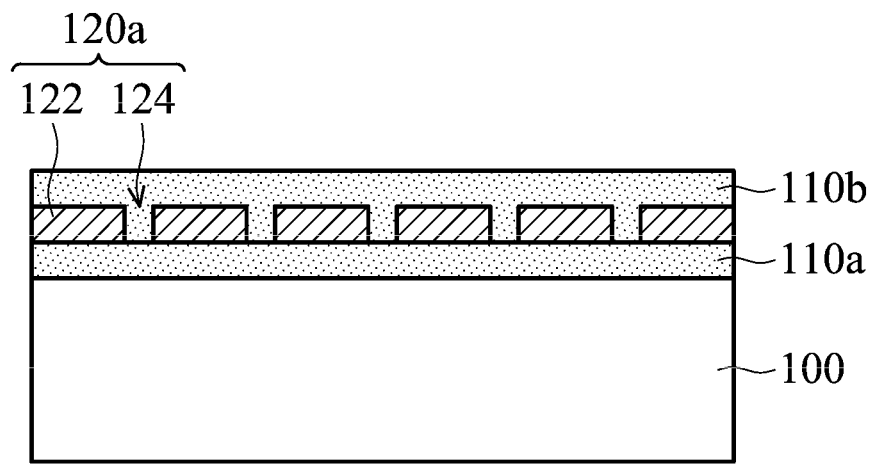

Next, as shown in FIG. 1C, another first metal layer 110b is formed on the continuous area 122 and the plurality of openings 124 of the second metal layer 120a. The first metal layer 110b may be formed by a process and a material similar with that of the first metal layer 110a thereunder. In one embodiment, the first metal layer 110b is a tin layer formed by a sputtering process. Since the plurality of openings 124 of the second metal layer 120a can function as a flow path for the first metal layer 110b when the process temperature is greater than or approximate to the melting point of the first metal layer 110b such that the fluidity of the first metal layer 110b is increased, the first metal layer 110b flows not only in the direction substantially parallel to the main surface of the second metal layer 120a but also in the direction toward the substrate 100 through the plurality of openings 124 of the second metal layer 120a. Accordingly, the probability that the first metal layer 110b flows to the outside of the solder structure is reduced. If the total basal area of the plurality of openings 124 of the second metal layer 120a is not greater than a half of the total area of the continuous region 122, the fluid region for the first metal layer 110b having high fluidity in the direction toward the substrate becomes small. Thus, compared with a situation in which the total basal area of the plurality of openings 124 of the second metal layer 120a is greater than a half of the total area of the continuous region 122, the efficiency of modifying the flowing direction of the first metal layer 110b by the second metal layer 120a is lower. Preferably, the total basal area of the plurality of openings 124 of the plurality of second metal layers 120a is less than nine-tenths of the total area of the continuous region 122.

Figure 1D:
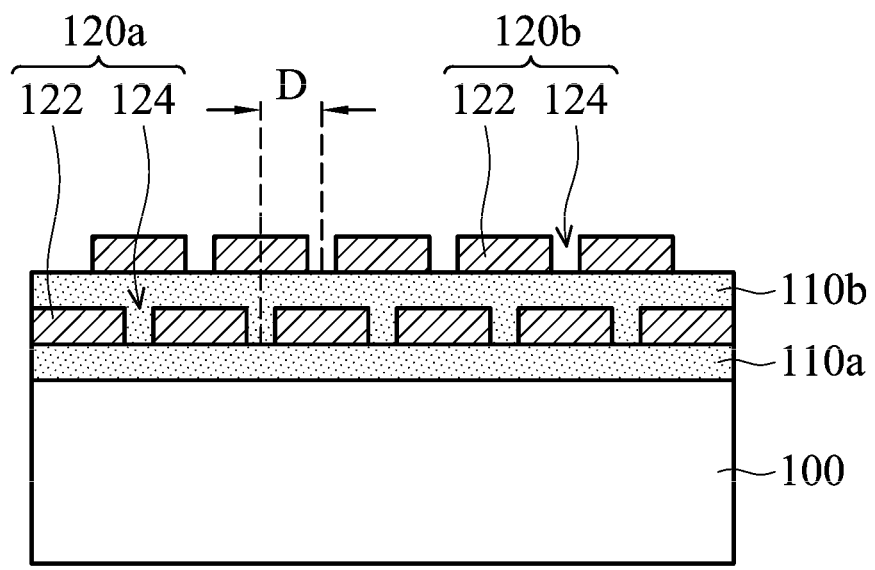

Thereafter, another second metal layer 120b having a continuous region 122 and a plurality of openings 124 is formed on the middle first metal layer 110b, as shown in FIG. 1D. The upper second metal layer 120b may include tin, copper, bismuth, gold, silver, nickel, or alloys thereof. The upper second metal layer 120b may be formed by a process and a material similar with or different from that of the lower second metal layer 120a as long as the plurality of openings 122 and the continuous region 124 of the second metal layer 120a can be similarly formed in the second metal layer 120b. However, both the second metal layer 120a and 120b must be formed by a metal material having a melting point higher than that of the first metal layers 110a and 110b. In one embodiment, the second metal layer 120b is a copper layer formed by a sputtering process.

Refer to FIGS. 1D, 4B, 5B, 6B, 7B, and 8B, the plurality of openings 124 of the second metal layer 120b may be formed as a rectangle and/or a circle, and each opening 124 may have the same or different sizes. Preferably, a total basal area of the plurality of openings 124 of the second metal layer 120a is greater than a half of a total area of the continuous region 122 and less than nine-tenths of a total area of the continuous region 122. Further refer to FIGS. 1B, 4A, 5A, 6A, 7A, and 8A, the orthographic projection of the plurality of openings 124 of the upper second metal layer 120b may be misaligned with the orthographic projection of the plurality of openings 124 of the lower second metal layer 120a, i.e., the orthographic projection of the plurality of openings 124 of the upper second metal layer 120b may have a horizontal offset distance D with respect to the orthographic projection of the plurality of openings 124 of the lower second metal layer 120a. The horizontal offset distance D is the horizontal offset distance between the central point of an opening 124 of the upper second metal layer 120b and the central point of an opening of the lower second metal layer 120a that is nearest to the opening 124 of the upper second metal layer 120b in the horizontal direction. When the largest opening in the plurality of openings 124 of the second metal layer 120a and the plurality of openings 124 of the second metal layer 120b is a circular opening, the horizontal offset distance D between the openings 124 of the adjacent second metal layers 120a and 120b is less than or equal to the diameter of the largest circular opening in the plurality of openings 124. When the largest opening of the plurality of openings 124 of the second metal layer 120a and the plurality of openings 124 of the second metal layer 120b is a rectangular opening, the horizontal offset distance D between the openings 124 in the adjacent second metal layers 120a and 120b is less than or equal to the side length of the largest rectangular opening in the plurality of openings 124.

In one embodiment, when the plurality of opening 124 of the second metal layer 120a is a plurality of rectangular openings that are regularly arranged and have substantially the same side lengths, the plurality of openings 124 of the second metal layers 120b is also a plurality of rectangular openings that are regularly arranged and have substantially the same side lengths. However, the orthographic projections of the pluralities of openings 124 of the second metal layers 120a and 120b are misaligned with each other on the substrate, as shown in FIGS. 4A and 4B. In one embodiment, when the plurality of openings 124 of the second metal layer 120a is a plurality of circular openings that are regularly arranged and have substantially the same diameter, the plurality of openings 124 of the second metal layers 120b is also a plurality of circular openings that are regularly arranged and have substantially the same diameters. However, the orthographic projections of the pluralities of openings 124 of the second metal layers 120a and 120b are misaligned with each other on the substrate, as shown in FIGS. 5A and 5B. In one embodiment, when the plurality of openings 124 of the second metal layer 120a is a plurality of circular openings that are regularly arranged but have different diameters (for example, a plurality of openings have relatively large diameters and a plurality of openings have relatively small diameters near each relatively large opening), the plurality of openings 124 of the second metal layers 120b is also a plurality of circular openings that are regularly arranged and have different diameters. However, the orthographic projections of the openings 124 of the second metal layers 120a and 120b are misaligned with each other on the substrate, as shown in FIGS. 6A and 6B. In one embodiment, when the plurality of openings 124 of the second metal layer 120a is a plurality of openings that are regularly arranged but have different shapes and sizes (for example, a plurality of circular openings have a relatively large size and a plurality of rectangular openings have a relatively small size near each relatively large opening), the plurality of openings 124 of the second metal layers 120b is also a plurality of circular openings that are regularly arranged and have different sizes and shapes. However, the orthographic projections of the pluralities of openings 124 of the second metal layers 120a and 120b are misaligned with each other on the substrate, as shown in FIGS. 7A, 7B and FIGS. 8A, 8B.

Figure 1E:
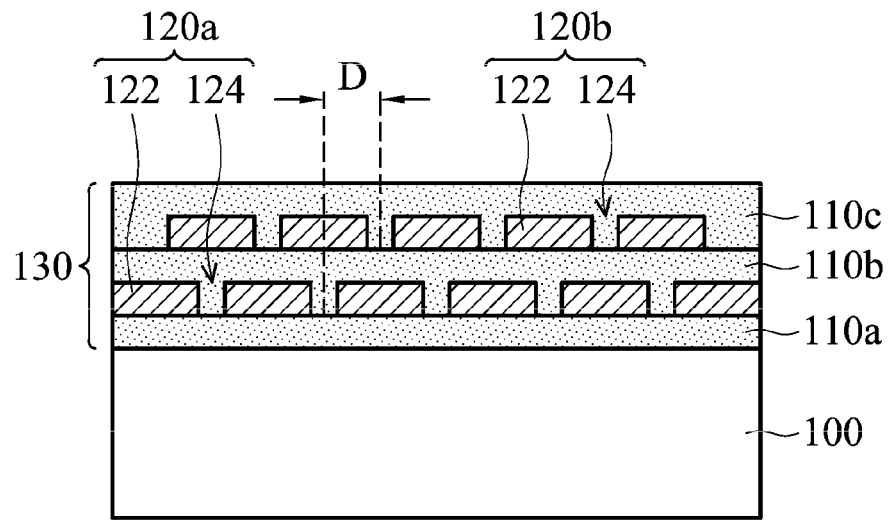

Refer to FIG. 1E, an upper first metal layer 110c is formed on the continuous region 122 and the plurality of openings 124 of the second metal layer 120b to provide a solder structure 130. When the process temperature is greater than or approximate to the melting point of the first metal layers 110b and 110c such that the fluidity of the first metal layers 110b and 110c is increased, the plurality of openings 124 of the second metal layer 120a and the plurality of openings 124 of the second metal layer 120b can function as the flow paths of the first metal layer 110b and 110c, respectively. Accordingly, not only can the first metal layer 110b flow in the direction toward the substrate 100 through the plurality of openings 124 of the second metal layer 110b but also the first metal layer 110c can flow in the direction toward the substrate 100 through the plurality of openings 124 of the second metal layer 120b, thereby reducing the probability that the first metal layers 110b and 110c flow to the outside of the solder structure. Moreover, due to the misalignment between the orthographic projections of the plurality of openings 124 of the second metal layers 120a and the orthographic projections of the plurality of openings 124 of the second metal layers 120b on the substrate, the first metal layer 110c may flow toward the substrate 100 by a zigzag path and therefore has a longer flow path. Accordingly, the efficiency of modifying the flow direction of the first metal layers 110b and 110c by the second metal layers 120a and 120b is increased.

Preferably, the solder structure 130 comprises at least three first metal layers and two second metal layers, wherein the first metal layers are the metal layers in direct contact with the substrate and the chip that is mounted on the substrate in the following process step. If the solder structure 130 has only a single second metal layer 120a (for example, refer to the structure shown in FIG. 1C), the flow path of the first metal layer 110b in the direction toward the substrate 100 becomes shorter and therefore the efficiency of modifying the flow direction of the first metal layer 110b by the second metal layer 120a becomes relatively low. Moreover, as long as the performance and the size of the chip are not negatively affected, the quantity of the first metal layers and the second metal layers in the solder structures 130 may be increased according to demands.

Figure 1F:
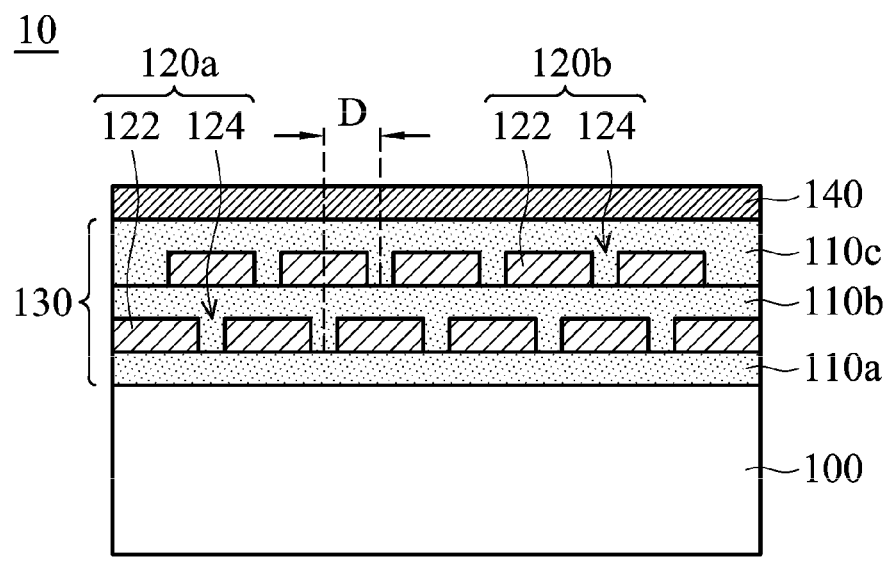

Finally, refer to FIG. 1F, after a chip 140 (for example, a light-emitting diode chip) is disposed on the solder structure 130, a heat treatment is performed to bond the chip 140 and the substrate 100 through a eutectic reaction of the solder structure 130. Thus, a eutectic solder structure for a chip 10 of the embodiment including the substrate 100 and the solder structure 130 disposed thereon is obtained, wherein the solder structure 130 includes an alternate lamination of first metal layers 110a, 110b and 110c and second metal layers 120a and 120b, wherein the second metal layers 120a and 120b respectively have a continuous region 122 and a plurality of openings 124, and the melting points of the second metal layers 120a and 120b are higher than those of the first metal layers 110a, 110b and 110c. The eutectic solder structure for a chip 10 further includes a chip 140, which is disposed on the solder structure 130 and is bonded to the substrate 100 through a eutectic reaction of the solder structures 130.

Figure 2:
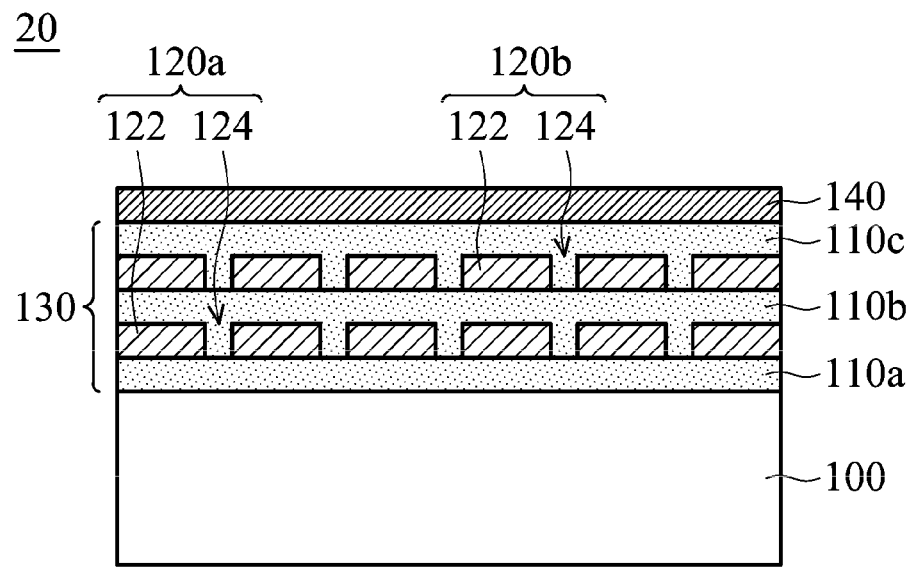
FIG. 2 is a cross-sectional view of a eutectic solder structure for a chip according to another embodiment of the present invention.

Alternatively, refer to FIG. 2, in another embodiment of the present invention, a eutectic solder structure for a chip 20 is provided in the case of the orthographic projections of the plurality of openings 124 of the second metal layer 120b overlapped with the orthographic projections of the plurality of openings 124 of the second metal layer 120a on the substrate 100. That is, there is no horizontal offset distance D between the orthographic projections of the plurality of openings 124 of the second metal layer 120b and the orthographic projections of the plurality of openings 124 of the second metal layer 120a thereunder on the substrate 100 (or, the horizontal offset distance D is zero).

Figure 3:
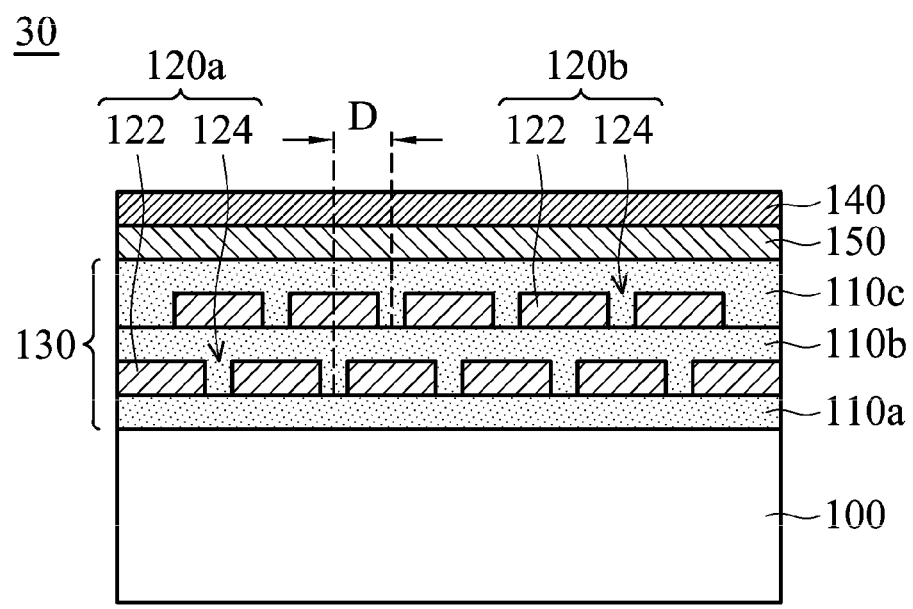
FIG. 3 is a cross-sectional view of a eutectic solder structure for a chip according to another embodiment of the present invention.

In addition, refer to FIG. 3, in yet another embodiment of the present invention, an eutectic solder structure for a chip 30 may further include an adhesion layer 150, which is interposed between the solder structure 130 and the chip 140 to increase the bonding strength of the eutectic solder structure for a chip 30.

According to the embodiments of the eutectic solder structure for a chip, a bonding process may be carried out at a relatively low temperature such that the negative effects on the elements due to the high temperature process can be avoided and the problems such as voids formed in the solder structure or a collapse of the solder structure due to the loss of the metal material having a lower melting point in conventional technology can be mitigated. In addition, the shrinkage of the eutectic structure area in the solder structure may also be avoided. Therefore, excellent bonding interface properties can be obtained. Moreover, using metal materials to form the eutectic solder structure for a chip can also enhance the heat dissipation of the chip.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A eutectic solder structure for a chip, comprising:
   a substrate;
   a solder structure on the substrate, wherein the solder structure includes an alternate lamination of a plurality of first metal layers and a plurality of second metal layers, wherein each second metal layer has a continuous region and a plurality of openings, and the melting point of the plurality of second metal layers is higher than that of the plurality of first metal layers, and wherein the orthographic projections of the openings of different second metal layers on the substrate are misaligned with each other; and
   a chip on the solder structure, wherein the chip is bonded to the substrate by an eutectic reaction of the solder structure.

2. The eutectic solder structure for a chip as claimed in claim 1, wherein a total basal area of the plurality of openings of each second metal layer is greater than a half of an area of the continuous region of each second metal layer.

3. The eutectic solder structure for a chip as claimed in claim 2, wherein a total basal area of the plurality of openings of each second metal layer is less than nine-tenths of the area of the continuous region of each second metal layer.

4. The eutectic solder structure for a chip as claimed in claim 1, wherein the shape of the plurality of openings of the plurality of second metal layers is circle, and a horizontal offset distance between the plurality of openings of adjacent second metal layers is less than or equal to the diameter of the largest opening of the plurality of openings of the plurality of the second metal layers.

5. The eutectic solder structure for a chip as claimed in claim 1, wherein the shape of the plurality of openings of the plurality of second metal layers is rectangle, and a horizontal offset distance between the plurality of openings of adjacent second metal layers is less than or equal to the side lengths of the largest opening of the plurality of openings of the plurality of the second metal layers.

6. The eutectic solder structure for a chip as claimed in claim 1, wherein the solder structure includes three first metal layers and two second metal layers, and one of the first metal layers is in direct contact with the substrate.

7. The eutectic solder structure for a chip as claimed in claim 1, wherein the plurality of first metal layers and the plurality of second metal layers are selected from tin, copper, bismuth, gold, silver, nickel, or an alloy thereof.

8. The eutectic solder structure for a chip as claimed in claim 1, further comprising an adhesion layer disposed between the solder structure and the chip.

* * * * *